United States Patent [19]

Schoofs et al.

[11] Patent Number: 4,689,501
[45] Date of Patent: Aug. 25, 1987

[54] SIGNAL LEVEL DETECTOR FOR COMPACT DISC PLAYER

[75] Inventors: Franciscus A. C. M. Schoofs; Martinus P. M. Bierhoff; Job F. P. Van Mil; Albert H. Slomp, all of Eindhoven, Netherlands

[73] Assignee: U.S. Philips Corporation, New York, N.Y.

[21] Appl. No.: 821,106

[22] Filed: Jan. 21, 1986

[30] Foreign Application Priority Data

Jan. 23, 1985 [NL] Netherlands ............ 8500171

[51] Int. Cl.⁴ ............................. H03K 5/153
[52] U.S. Cl. ........................ 307/362; 307/234; 307/354; 307/542
[58] Field of Search ............ 307/234, 354, 362, 350, 307/542; 328/128, 165, 185

[56] References Cited

U.S. PATENT DOCUMENTS 3,277,311 10/1966 Merlen et al. .................. 307/234
3,290,518 12/1966 Guisinger ....................... 307/234
3,575,664 4/1971 Kamin .......................... 307/234

Primary Examiner—John Zazworsky

Attorney, Agent, or Firm—Thomas A. Briody; William J. Streeter; Marianne R. Rich

[57] ABSTRACT

For detecting whether an input signal is above or below a reference level in such a way that brief signal interruptions and negative spurious pulses are not interpreted as decreases below the reference level, the detector includes an input comparator, a first delay circuit, a second delay circuit and an output circuit. The first delay circuit comprises a first integrator comprising a first transistor and a first capacitor, a first current source and a second comparator. The second delay circuit comprises a second integrator with a second transistor and a second capacitor, a second current source and a third comparator. The first delay circuit and the second delay circuit have equal delay times. In order to ensure that during detection of a decrease below the reference level a positive spurious pulse is not interpreted as an increase above the reference level a third Transistor connects a third current source in parallel with the first current source of the first delay circuit when the input signal lies below the reference level, so that the delay time of the first delay circuit becomes smaller than that of the second delay circuit.

3 Claims, 4 Drawing Figures a b c d

SIGNAL LEVEL DETECTOR FOR COMPACT DISC PLAYER

BACKGROUND OF THE INVENTION

1. Field of the Invention

The invention relates to a signal level detector for a compact disc player and, more particularly, to a level detector furnishing an output for controlling the position of the beam relative to the track.

2. Description of the Prior Art

Such a level detector may be employed in, for example, a Compact Disc Audio player. At the time of filing of the present Application such a player is commercially available under the type designation Philips CD 303. In such a player the digital audio information in the form of a spiral tracks of pits and lands is read by means of a laser beam and converted into a signal current. This signal current constitutes a sequence of sinusoidal pulses of variable width. The signal is amplified and applied to inter alia a plurality of level detectors, in which the signal level of the rectified signal is compared with a plurality of reference levels in order to supply control signals for the various control devices employed in a compact-disc player if these reference levels are not reached. The player has, for example, a tracking system in order to keep the laser beam on the track. The maximum signal level is obtained if the laser beam follows the center of the track. If the beam is offset from this center, the signal level decreases. If a level corresponding to approximately 60% of the nominal level is not reached, a level detector generates a control signal by means of which the laser beam is returned to the center of the track. In addition, the player has level detectors which, if a level corresponding to approximately 50% and 20% of the nominal level is not reached generate a control signal for respectively disabling a phase-locked loop in the speed-control system, which system becomes unreliable for low signal levels, and for detecting the absence of the signal as a result of flaws in and on the disc, so called drop-outs. For these control systems it is important that the level detectors accurately detect whether the levels are reached and in such a way that brief interruptions in the signal level between two consecutive pulses and spurious pulses cannot actuate these control systems.

In the known compact-disc player the level detectors are constructed as a discrete circuits with non-integrable capacitors. However, it may be desirable to integrate these detectors on the same substrate as the other control circuits. A level detector which, in prinicple, is suitable for this purpose is known from U.S. Pat. No. 4,338,530.

In this detector the input signal is applied to a comparator which compares the input signal level with a reference level. The output signal of this comparator is applied to a first delay circuit which ensures that if the input signal briefly decreases below the reference level of the comparator such a decrease does not produce an output signal on the output of the level detector. The level detector only produces an output signal on its output when the input signal has remained below the reference level of the comparator for a specific time interval. A second delay circuit ensures that when the input signal again exceeds the reference level of the comparator the output signal of the level detector is sustained until the input signal has remained above the reference level for a specific second time interval.

A drawback of this detector is that if the first time interval and the second time interval are equal to each other, which is desirable for the above-mentioned uses, a positive spurious pulse during a detected decrease below the reference level will be interpreted as an increase above the reference level. This leads to an undesired actuation of further circuits.

SUMMARY OF THE INVENTION

It is an object of the invention to improve the known level detector in such a way that the above problem is eliminated. According to the invention a level detector of the type defined in the opening paragraph is therefore characterized in that the first time interval and the second time interval are substantially equal to each other, in that a switchable third current source is arranged in parallel with the first current source, and in that the level detector is provided with switching means for switching on the third current source if the output of the third comparator of the second delay circuit is currentless.

At the instant at which a decrease below the reference level is detected, the third current source causes the first time interval of the first delay circuit to become smaller than the second time interval of the second delay circuit. This ensures that during a detected decrease below the reference level a positive spurious pulse is not detected as an increase above the reference level.

In one embodiment of the invention the second comparator comprises a first transistor of a first conductivity type having an emitter, a base and a collector, the emitter constituting the first input, the base constituting the second input and the collector constituting the output, and the third comparator comprises a second transistor of the first conductivity type having an emitter, a base and a first and second collector the emitter constituting the first input, the base constituting the second input and the first collector constituting the output, and in that the switching means comprise a third transistor of a second conductivity type opposite to the first conductivity type, having a base, an emitter and a collector, the base being connected to the second collector of the second transistor and the collector being connected to the third current source and, via a diode, to the output of the second comparator.

A further embodiment of the invention is characterized in that the first integrator comprises a fourth transistor (first integrator transistor) of the second conductivity type having a base, an emitter and a collector, the base being connected to the output of the input comparator, the emitter being connected to a point carrying a reference potential, and the collector being connected to the first current source, in that the second integrator comprises a fifth transistor (second integrator transistor) of the second conductivity type having a base, an emitter and a collector, the base being connected to the output of the second comparator, the emitter being connected to the point carrying a reference potential, and the collector being connected to the second current source, and in that the first current source, the second current source and the third current source each supply an output current which is proportional to the current-gain factor of a transistor of the second conductivity type.

DESCRIPTION OF THE PREFERRED EMBODIMENT

Figure 1:
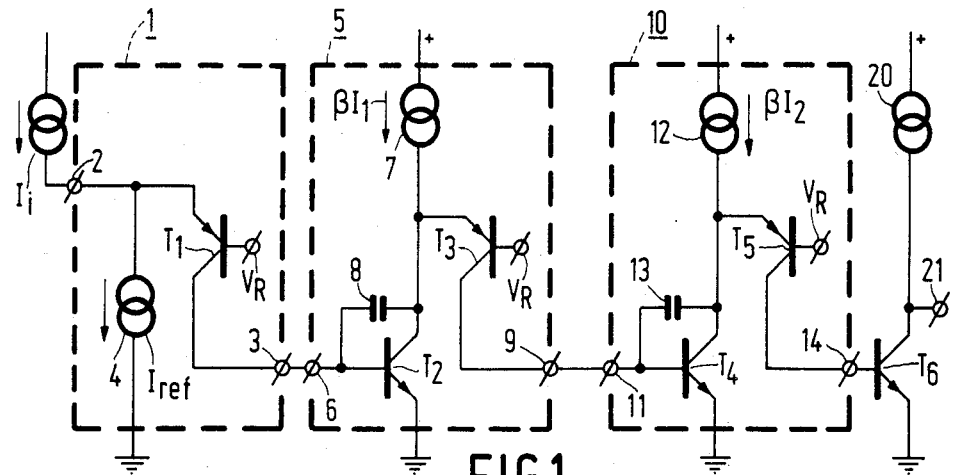
FIG. 1 shows a known level detector.

FIG. 1 shows a known level detector. The level detector comprises an input comparator 1 having an input 2 to which the input signal, in the present case an input current $I_i$, is applied. The output of a current source 4 carrying a reference current $I_{ref}$ is applied to the input 2. Further, the input 2 is connected to the emitter of a PNP transistor $T_1$ whose base is at a constant voltage $V_R$ and whose collector is connected to the output 3 of the input comparator 1. This output 3 is connected to the input 6 of a first delay circuit 5. This circuit comprises an integrator comprising an NPN transistor $T_2$ whose base is connected to the input 6 and whose emitter is connected to the negative power-supply terminal, in the present case earth.

Between the collector and the base of a transistor $T_2$ a capacitor 8 is arranged, which may for example be constituted by the collector-base capacitance of the transistor itself. The collector of the transistor $T_2$ is connected to the positive power-supply terminal by a current source 7. This current source 7 carries a current $\beta I_1$, i.e. a current which depends on the current gain factor $\beta$ of a transistor. Such a current source can be realised, for example, by applying a constant current $I_1$ to the base of a transistor and using the collector current as the output current. The collector of the transistor $T_2$ is further connected to the emitter of a PNP transistor $T_3$ whose base is at a constant voltage $V_R$ and whose collector is connected to the output 9 of the first delay circuit 5. The transistor $T_3$ forms the comparator of the first delay circuit 5. A second delay circuit 10 comprising transistors $T_4$ and $T_5$, a capacitor 13 and a current source 13 is constructed in the same way as the first delay circuit 5. The input 11 of this second delay circuit is connected to the output 9 of the first delay circuit. The output 14 is connected to the base of an NPN transistor $T_6$ whose collector is connected to the positive power-supply terminal by a current source 20. The collector of the transistor $T_6$ is connected to the output 21 of the level detector. The transistor $T_6$ with the current source 20 amplifies and inverts the output current of the second delay circuit 10.

Figure 2:
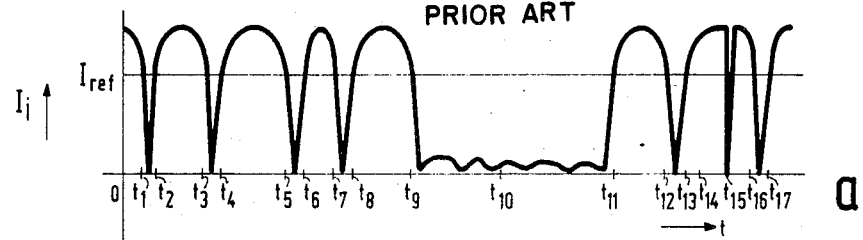
FIG. 2 shows waveforms to explain the operation of the arrangement shown in FIG. 1.
Figure 2:
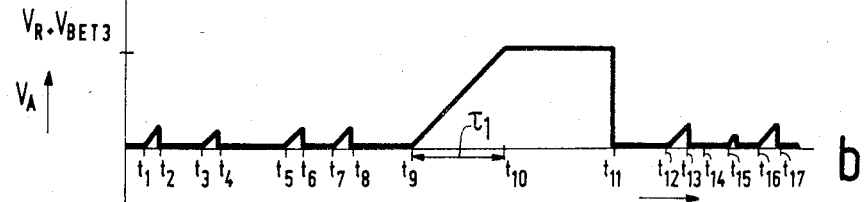
Figure 2:
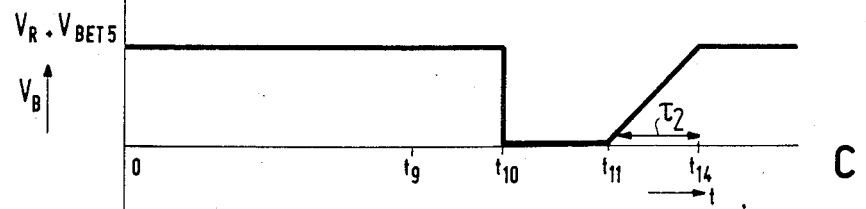
Figure 2:
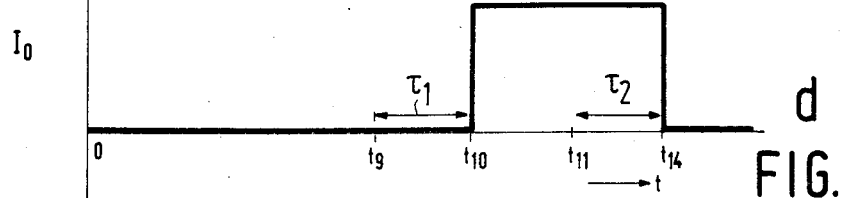

The operation of the arrangement will now be described in more detail with reference to FIG. 2. FIG. 2, line a shows the waveform of the input signal applied to the input 2 of the level detector. In the present example the input signal is the amplified and rectified signal current obtained by reading a compact disc. The input current $I_i$ comprises a sequence of sinewave pulses of variable width. This input current $I_i$ is compared with a reference current $I_{ref}$ to generate a control signal if the maximum signal current $I_i$ is a smaller than the reference current $I_{ref}$, in such a way that if the reference level $I_{ref}$ is not reached for a short time between two consecutive sinewave pulses this should not be detected. It is assumed that at the instant $t=0$ the current $I_i$ is larger than the reference current $I_{ref}$. The voltage on the emitter of the transistor $T_1$ is consequently higher than the voltage $V_R$ on its base, so that this transistor conducts and the difference between the input current $I_i$ and the reference current $I_{ref}$ is applied to the input 6 of the first delay circuit 5. The transistor $T_2$ is then turned on and is almost fully saturated. As a result of this, capacitor 8 is then discharged almost completely and the voltage $V_A$ on the collector of the transistor $T_2$, whose waveform is shown in line b, is substantially zero volts. Consequently, the transistor $T_3$ is cut off, so that the entire current $\beta I_1$, from the current source 7 flows through the transistor $T_2$. Then no current is applied to the input 11 of the second delay circuit 10, so that the transistor $T_4$ does not conduct. The capacitor 13 is then charged, in which case the voltage $V_B$ on the collector of the transistor $T_4$, whose waveform is shown in line c, is equal to $V_B = V_R + V_{BET5}$, where $V_{BET5}$ is the base-emitter voltage of the transistor $T_5$. The current $\beta I_2$ from the current source 12 is then applied to the base of the transistor $T_6$ via the transistor $T_5$, so that this transistor $T_6$ conducts and receives the current from the current source 20. The output 21 is then currentless, as is illustrated in FIG. 2d.

If at the instant $t=t_1$ the current $I_i$ is smaller than the current $I_{ref}$, the transistor $T_1$ and consequently the transistor $T_2$ are cut off. The capacitor 8 is then charged by the current $\beta I_1$ from the current source 7, so that the voltage $V_A$ increases. As the instant $t=t_2$ the current $I_i$ becomes larger than the current $I_{ref}$. The transistor $T_2$ is turned on again via the transistor $T_1$. The capacitor $C_8$ is then almost wholly discharged immediately, so that the voltage $V_A$ becomes again substantially zero volts. The capacitor 8 has a comparatively low capacitance C. However, as a result of the Miller effect this capacitor, as seen from the collector of the transistor $T_2$, has a capacitance which is $(\beta+1)$ times as high. As a result of this, the voltage $V_A$ on the collector of the transistor $T_2$ increases only slowly in the interval $t_1 = t_2$ and does not reach the level at which the transistor $T_3$ is turned on. In this way it is achieved that if the current $I_1$ briefly decreases below the reference level $I_{ref}$ this has no effect on the output 21. In a similar way the interruptions between the instants $t_3-t_4$; $t_5-t_6$ and $t_7-t_8$ have no effect on the output 21. At the instant $t=t_9$ current $I_i$ again becomes smaller than the current $I_{ref}$ and now remains below this level for a considerable time due to the absence of a signal, for example as a result of a dropout. The transistor $T_2$ is then turned off. The capacitor $C_8$ is now charged to such an extent that after a time $\tau_1$ at the instant $t=t_{10}$ the voltage on the collector of the transistor $T_2$ becomes equal to $V_A = V_R + V_{BET3}$, where $V_{BET3}$ is the base-emitter voltage of the transistor $T_3$. The current $\beta I_1$ from the current source 7 then flows to the base of the transistor $T_4$ via the transistor $T_3$, so that this transistor $T_4$ is turned on. The capacitor 13 is now almost wholly discharged immediately so that the voltage $V_B$ becomes zero volts. As a result of this, the transistor $T_5$ is turned off, so that the transistor $T_6$ also becomes currentless. The current from the current source 20 now flows to the output 21 of the level detector. If the current $I_i$ becomes smaller than the current $I_{ref}$, this is only detected at the output of the level detector if the current $I_1$ has remained smaller than the current $I_{ref}$ for at least a time interval $\tau_1$.

The delay time $\tau_1$ is given by:

$$\tau_1 = \frac{(\beta + 1) C \cdot V_R}{\beta I_1} \approx \frac{C V_R}{I_1}$$

where $(\beta+1)$ C is the total Miller-multiplied capacitance, $V_R$ is the voltage across the capacitor 8 in the charged condition, and $\beta I_1$ is the current of the current source 7. The $\beta$-dependence of the current from the current source 7 ensures that the delay time $\tau_1$ is independent of $\beta$ and variations thereof.

The delay time $\tau_1$ can be adjusted by means of the current $\beta I_1$, the voltage $V_R$ on the base of the transistor $T_2$ and the capacitance C of the capacitor $C_8$. The delay time $\tau_1$ should be adjusted in such a way that this time is longer than the maximum period of the input signal or, in the case of a rectified signal such as the signal shown in FIG. 2a, the maximum half-cycle of the signal. For the signal shown in FIG. 2a this maximum half-cycle is approximately 1 μs. The delay time $\tau_1$ may then be selected to be for example $\tau_1 \approx 10$ μs. Such a time can be obtained, for example, by means of a collector-base capacitance of the transistor $T_2$ of $C \approx 1$ pF, a current $I_1 \approx 0.3$ μA and a voltage $V_R \approx 3$ V.

At the instant $t=t_{11}$ the current $I_i$ again becomes larger than the current $I_{ref}$. Via the $T_1$ the transistor $T_2$ is turned on, so that the capacitor $C_8$ is discharged and the voltage $V_A$ becomes zero volts again. The transistor $T_3$ and the transistor $T_4$ are consequently cut off. As a result of this, the capacitor 13 is charged. If the reference level $I_{ref}$ is not reached briefly as between the instants $t_{12}$ and $t_{13}$, this has no influence on the charging of the capacitor 13. After a time $\tau_2$ at the instant $t_{14}$ the voltage on the collector of the transistor $T_4$ becomes $V_B = V_R + V_{BET5}$. The current $\beta I_2$ from the current source 12 then turns on the transistor $T_6$ via the transistor $T_5$, so that the output 21 becomes currentless again. The current $I_i$ should therefore be above the reference level $I_{ref}$ for a period $\tau_2$ before this is detected on then output of the level detector. Brief interruptions of the signal during the time $\tau_2$ are not regarded as excursions below the level. The delay time $\tau_2$ may be selected to be equal or unequal to the delay time $\tau_1$ the time $\tau_2$ being adjustable in the same way as the time $\tau_1$.

As a result of the appearance of a negative spurious pulse or spike at the instant $t=t_{15}$ during a signal pulse the current $I_i$ becomes smaller than the current $I_{ref}$ very briefly. This spurious pulse is suppressed in the same way as brief signal interruptions between two consecutive signal pulses.

A drawback of the arrangement shown in FIG. 1 is that if a positive spurious pulse occurs between the instants $t_{10}$ and $t_{11}$, this is detected as an increase above the reference level and results in a corresponding signal on the output 21. When the spurious pulse exceeds the reference level the capacitor 8 is discharged rapidly and at the same time charging of the capacitor 13 is started. If, briefly after this, the level decreases below the reference level, charging of the capacitor 8 begins. As the charging of the capacitor 13 has started earlier, the voltage $V_B$ on the collector of the transistor $T_4$ reaches the level at which the transistor $T_5$ is turned on before the voltage $V_A$ on the collector of the transistor $T_2$ has reached the level at which the transistor $T_3$ is turned on and discharges said capacitor 13. The spurious pulse is transferred to the output 21 of the detector because the transistor $T_5$ is turned on.

Figure 3:
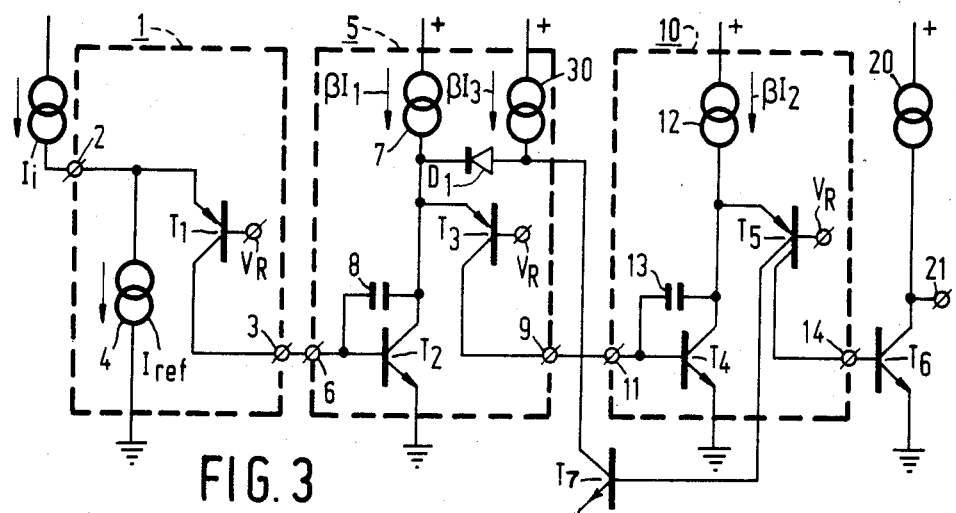
FIG. 3 shows a level detector in accordance with the invention.
Figure 4:
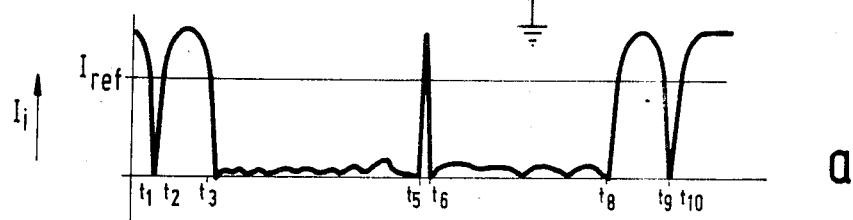
FIG. 4 shows some waveforms to explain the operation of the arrangement shown in FIG. 3.
Figure 4:
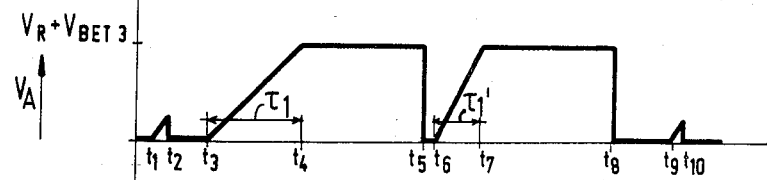
Figure 4:
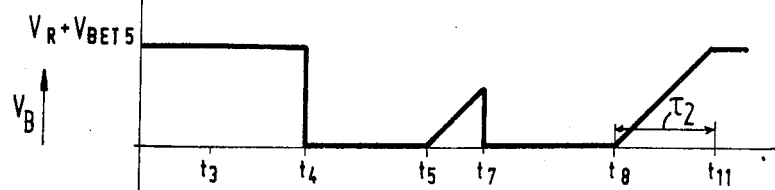
Figure 4:
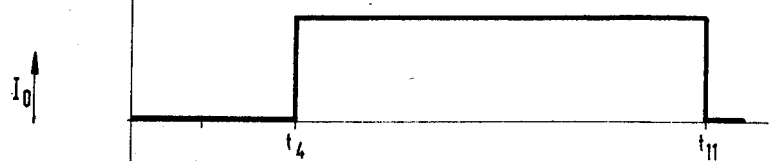

A level detector in accordance with the invention is shown in FIG. 3 in which identical parts bear the same reference numerals as in FIG. 1. In this embodiment the transistor $T_5$ in the delay circuit 10 is provided with a second collector. This second collector is connected to the base of a NPN transistor $T_7$, whose emitter is connected to the negative power-supply terminal and whose collector is connected to the positive power-supply terminal by the current source 30 carrying a current $\beta I_3$ and to the collector of the transistor $T_2$ by a diode $D_1$. The transistor $T_7$ operates as a switch by means of which the current source 30 can be connected in parallel with the current source 7. In the present embodiment the currents $\beta I_1$ and $\beta I_2$ from the current sources 7 and 12 are substantially equal to one another, so that in the case of equal capacitors 8 and 13 and equal voltages on the bases of the transistors $T_3$ and $T_5$ equal delays $\tau_1$ and $\tau_2$ are obtained, which is desirable for some purposes. In the present example the current $\beta I_3$ from the current source 30 is selected to be equal to $\beta I_1$, but this need not be necessarily so. The operation of the arrangement will be explained with reference to FIG. 4. FIG. 4 line a again represents the input signal $I_i$, lines b and c represent the voltage $V_A$ and the voltage $V_B$ on the collectors of the respective transistors $T_2$ and $T_4$, and line d represents the output current $I_o$. It is assumed that at the instant $t=0$ the input current $I_i$ is larger than the reference current $I_{ref}$. In this situation the voltage $V_B$ on the collector of the transistor $T_4$ is high and the transistor $T_5$ conducts, so that the transistor $T_7$ is driven into conduction. This transistor $T_7$ consequently receives the full current $\beta I_3$ from the current source 30. The diode $D_1$ is then cut off and prevents a part of the current $\beta I_1$ from flowing from the current source to the transistor $T_7$.

If the input current decreases below the reference level $I_{ref}$ between two consecutive sinewave pulses, such as between the instants $t=t_1$ and $t=t_2$ and if negative spurious pulses appear during a sinewave pulse, this does not affect the output of the level detector, in the same way as in the circuit arrangement shown in FIG. 1. At the instant $t=t_3$ the current $I_i$ again becomes smaller than the current $I_{ref}$. After a time $\tau_1$ at the instant $t=t_4$, the voltage $V_A$ reaches the level at which the transistor $T_3$ is turned on. As a result of this, the voltage $V_B$ decreases and a current flows to the output 21. Since the transistor $T_5$ is cut off the transistor $T_7$ is also cut off, so that the current source 30 is connected in parallel with the current source 7. If at the instant $t=t_5$ as a result of a positive spurious pulse the current $I_i$ becomes larger than the current $I_{ref}$ the capacitor 8 is discharged rapidly and charging of the capacitor 30 begins. Very briefly after this at the instant $t=t_7$ the current $I_i$ again becomes smaller than the current $I_{ref}$, so that the charging of the capacitor 8 begins. Since the current source 30 is connected in parallel with the current source 7, the capacitor 8 is charged more rapidly than the capacitor 13, i.e. 2× as fast in the present embodiment. The voltage $V_A$ on the collector of the transistor $T_2$ then reaches the level at which the transistor $T_3$ is turned on in a time $\tau_i$ which is smaller than the time $\tau_2$ in which the voltage $V_B$ on the collector of the transistor $T_4$ has reached the level at which the transistor $T_5$ is turned on. Since the transistor $T_3$ is turned on the capacitor 13 is discharged rapidly. As a result of this, the transistor $T_5$ remains in the non-conductive state, so that the positive spurious pulse is not transferred to the output. It is to be noted that in the arrangement of FIG. 1 positive spurious pulses are also suppressed if the delay time $\tau_2$ is selected to be longer than the delay time $\tau_1$, which is easy to demonstrate.

The invention is not limited to the present embodiments. For example, the input comparator 1 may be constructed in different ways. Instead of a current the input signal may be a voltage which is compared with a reference voltage by means of a voltage comparator having a current output. In principle, the output transistor $T_6$ with the current source 20 may be dispensed with. However, alternatively, these elements may be replaced by another output circuit. The integrators and comparators of the delay circuits may also be constructed in a manner other than shown. In the arangement shown in FIG. 2 the current source 30 may also be arranged in parallel with the current source 7 in any other way. Finally, it is to be noted that the transistor may, of course, be replaced by transistors of opposite conductivity types.

What is claimed is:

1. A level detector having an input for receiving an input signal and an output for supplying an output signal, comprising
    a first input comparator having an input and an output, for comparing the level of the input signal with a reference level, which input is coupled to the input of the level detector,
    a first delay circuit for starting the output signal if the level of the input signal decreases below the reference level during a first time interval, which delay circuit comprises a first integrator comprising a first capacitor arranged between an input and an output of the integrator, which input is coupled to the output of the input comparator and which output is coupled to a first current source and to a first input of a second comparator which has a second input for receiving a reference potential and an output,
    a second delay circuit for stopping the output signal if the level of the input signal exceeds the reference level during a second time interval, which delay circuit comprises a second integrator comprising a second capacitor arranged between an input and an output of the integrator, which input is coupled to the output of the second comparator and which output is coupled to a second current source and to a first input of a third comparator having a second input for carrying a reference potential and on output which is coupled to the output of the level detector, characterized in that the first time interval and the second time interval are substantially equal to each other, in that a switchable third current source is arranged in parallel with the first current source, and in that the level detector is provided with switching means for switching on the third current source if the output of the third comparator of the second delay circuit is currentless.

2. A level detector as claimed in claim 1, characterized in that the second comparator comprises a first transistor of a first conductivity type having an emitter, a base and a collector, the emitter constituting the first input, the base constituting the second input and the collector constituting the output, and the third comparator comprises a second transistor of the first conductivity type having an emitter, a base and a first and second collector the emitter constituting the first input, the base constituting the second input and the first collector constituting the output, and in that the switching means comprise a third transistor of a second conductivity type opposite to the first conductivity type, having a base, an emitter and a collector, the base being connected to the second collector of the second transistor and the collector being connected to the third current source and, via a diode, to the output of the first delay circuit.

3. A level detector as claimed in claim 1, wherein said first integrator comprises a first integrator transistor of the second conductivity type having a base, an emitter and a collector, the base being connected to the output of the input comparator, the emitter being connected to a point carrying a reference potential, and the collector being connected to the first current source; and wherein said second integrator comprises a second integrator transistor of the second conductivity type having a base, an emitter and a collector, the base being connected to the output of the second comparator, the emitter being connected to the point carrying a reference potential, and the collector being connected to the second current source, and in that the first current source, the second current source and the third current source each supply an output current which is proportional to the current-gain factor of a transistor of the second conductivity type.

* * * * *